(12) United States Patent
Steedman et al.

(10) Patent No.: US 9,281,808 B2
(45) Date of Patent: Mar. 8, 2016

(54) VARIABLE VOLTAGE LEVEL TRANSLATOR

(71) Applicant: Microchip Technology Incorporated, Chandler, AZ (US)

(72) Inventors: Sean Steedman, Phoenix, AZ (US); Fanie Duvenhage, Phoenix, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 14/199,838

(22) Filed: Mar. 6, 2014

(65) Prior Publication Data

US 2014/0253212 A1    Sep. 11, 2014

Related U.S. Application Data

(60) Provisional application No. 61/775,368, filed on Mar. 8, 2013.

(51) Int. Cl.
| | |
|---|---|
| H03L 5/00 | (2006.01) |
| H03K 3/356 | (2006.01) |
| G06F 1/32 | (2006.01) |
| H03K 19/0185 | (2006.01) |

(52) U.S. Cl.
CPC ........ *H03K 3/356104* (2013.01); *G06F 1/3243* (2013.01); *H03K 19/018557* (2013.01); *H03K 19/018585* (2013.01)

(58) Field of Classification Search
CPC ................ H03K 19/018521; H03K 3/356113
USPC .......................................... 327/333; 326/80, 81
See application file for complete search history.

(56) References Cited

U.S. PATENT DOCUMENTS

| | | | | |
|---|---|---|---|---|
| 4,853,560 | A * | 8/1989 | Iwamura et al. ................ 326/80 |
| 7,215,150 | B2 * | 5/2007 | Torres et al. .................... 326/83 |
| 7,239,198 | B1 * | 7/2007 | Drapkin et al. ................ 327/563 |
| 7,414,442 | B2 * | 8/2008 | Uno ............... 327/112 |
| 7,498,835 | B1 | 3/2009 | Rahman et al. ................ 326/38 |
| 8,836,370 | B2 * | 9/2014 | Kim et al. ....................... 326/63 |
| 2002/0027466 | A1 * | 3/2002 | Taguchi ........................ 327/333 |
| 2004/0027160 | A1 * | 2/2004 | Joshi et al. .................... 326/81 |
| 2006/0039206 | A1 * | 2/2006 | Taniguchi et al. ........ 365/189.05 |
| 2009/0121783 | A1 * | 5/2009 | Chiang et al. ................. 327/538 |
| 2012/0269240 | A1 * | 10/2012 | Balteanu et al. ............. 375/219 |
| 2014/0237280 | A1 * | 8/2014 | Muto ............... 713/323 |
| 2014/0251836 | A1 * | 9/2014 | Feeney ........................ 205/792 |
| 2014/0253212 | A1 * | 9/2014 | Steedman et al. ............ 327/333 |
| 2014/0254209 | A1 * | 9/2014 | Takagi et al. .............. 363/21.04 |

OTHER PUBLICATIONS

International Search Report and Written Opinion, Application No. PCT/US2014/021543, 14 pages, Jun. 18, 2014.

* cited by examiner

*Primary Examiner* — Ryan Jager

(74) *Attorney, Agent, or Firm* — Slayden Grubert Beard PLLC

(57) ABSTRACT

An integrated circuit including a processor configured to operate off a supply voltage being applied at one of a plurality of external pins; and internal input/output circuitry configured to select between the supply voltage and at least one other supply voltage being applied at another of the plurality of external pins.

19 Claims, 3 Drawing Sheets

VARIABLE VOLTAGE LEVEL TRANSLATOR

CROSS REFERENCE TO RELATED APPLICATIONS

This application claims the benefit of U.S. Provisional Patent Application Ser. No. 61/775,368 filed Mar. 8, 2013, which is hereby incorporated by reference in its entirety for all purposes as if fully set forth herein.

TECHNICAL FIELD

The present disclosure relates to a variable voltage level translator, in particular a microcontroller comprising such a variable voltage level translator.

BACKGROUND

Many circuit configurations require modules to operate in different voltage domains, i.e., with different supply voltages. In such cases, level shifting circuitry is required to convert signals from one domain to another.

For example, shown in FIG. 1 is a system 100 including a 3.3-5 V power supply 101, a microprocessor (MPU) unit 102 and a peripheral controller 104. The MPU 102 operates at 1.8 V, provided by linear regulator 108. The peripheral controller 104 operates using the supply voltage of 3.3-5 V. Such a peripheral controller may, e.g., be used in a standby mode to perform battery monitoring or ADC (analog-to-digital converter) scans for a capacitive touch sensor (not shown). In such a circuit, the MPU 102 functions as the primary application controller. In order to convert signals from the peripheral controller 104 to be readable by the MPU 102 (and vice versa), level shifting circuitry 106 is required.

In many cases, the development of such level shifting circuitry is time consuming and complex and can cause difficulties in developing microcontroller products.

SUMMARY

An integrated circuit (IC) device according to embodiments includes a microcontroller with an input/output I/O circuitry comprising a plurality of input/output ports, the IC device comprising a plurality of external pins coupled with the microcontroller; wherein the microcontroller comprises an I/O voltage supply which can select at least two different I/O supply voltages.

In some embodiments, the I/O voltage supply is coupled with an external pin separate from a power supply pin, wherein the external pin is coupled with a voltage source having a voltage different from a power supply voltage available at the power supply pin to allow operation of the I/O circuitry with different voltage levels. In some embodiments, the I/O voltage supply comprises a switching unit operable to couple the I/O voltage supply with one of a plurality of supply voltages. The switching unit may be operable to couple the I/O voltage supply with one of: an internal supply voltage provided by the power supply pin or an internal voltage regulator and an external I/O voltage provided by the external pin. The switching unit may further allow selecting an internal voltage generated by a digital-to analog converter. In some embodiments, the I/O voltage supply includes a buffer amplifier.

A method of operating an IC device comprising a microcontroller with an input/output I/O circuitry comprising a plurality of input/output ports, the IC device comprising a plurality of external pins coupled with the microcontroller; wherein the microcontroller comprises an I/O voltage supply which can select at least two different I/O supply voltages, wherein an I/O pin is configured as a multi-level serial transmitter output, wherein a serial signal is transmitted having at least three voltage levels including, a power supply voltage level, ground level, and an I/O supply voltage level.

A microprocessor according to embodiments includes input/output (I/O) circuitry including an integrated level shifter for selecting between a plurality of supply voltages. In some embodiments, the I/O circuitry is configured to sense and apply the plurality of supply voltages.

In some embodiments, sensing circuitry is provided including a plurality of switches for switching the plurality of supply voltages. In some embodiments, the sensing circuitry including a multiplexer for switching the plurality of supply voltages. In some embodiments, a buffer amplifier is provided. In some embodiments, the plurality of voltages comprise a device supply voltage and an external source voltage. In some embodiments, the plurality of voltages comprise an output of a digital-to-analog converter.

An integrated circuit including a plurality of external pins, according to embodiments includes a processor configured to operate off a supply voltage being applied at one of the plurality of external pins; and internal input/output circuitry configured to select between the supply voltage and at least one other supply voltage being applied at another of the plurality of external pins.

In some embodiments, the internal input/output circuitry includes switches between each of the pins and associated pad circuitry of the input/output circuitry. In some embodiments, a multiplexer is interposed between the pins and associated pad circuitry of the input/output circuitry. In some embodiments, a buffer is provided between the multiplexer and the associated pad circuitry. In some embodiments, the input/output circuitry is further configured to select an internal digital-to-analog converter voltage.

These, and other, aspects of the disclosure will be better appreciated and understood when considered in conjunction with the following description and the accompanying drawings. It should be understood, however, that the following description, while indicating various embodiments of the disclosure and numerous specific details thereof, is given by way of illustration and not of limitation. Many substitutions, modifications, additions and/or rearrangements may be made within the scope of the disclosure without departing from the spirit thereof, and the disclosure includes all such substitutions, modifications, additions and/or rearrangements.

BRIEF DESCRIPTION OF THE DRAWINGS

The drawings accompanying and forming part of this specification are included to depict certain aspects of the disclosure. It should be noted that the features illustrated in the drawings are not necessarily drawn to scale. A more complete understanding of the disclosure and the advantages thereof may be acquired by referring to the following description, taken in conjunction with the accompanying drawings in which like reference numbers indicate like features and wherein.

DETAILED DESCRIPTION

Figure 1:
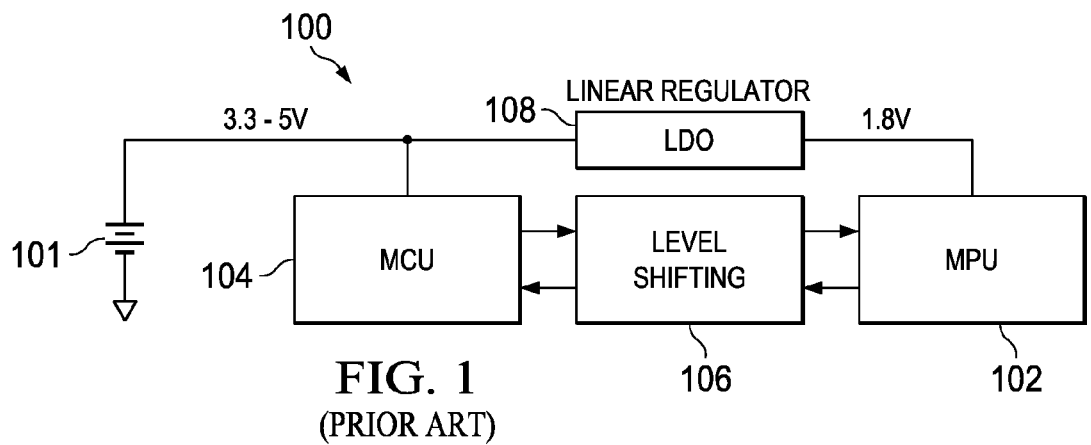
FIG. 1 is a diagram of a level shifting circuit configuration according to the prior art.

The disclosure and various features and advantageous details thereof are explained more fully with reference to the exemplary, and therefore non-limiting, embodiments illustrated in the accompanying drawings and detailed in the following description. It should be understood, however, that the detailed description and the specific examples, while indicating the preferred embodiments, are given by way of illustration only and not by way of limitation. Descriptions of known programming techniques, computer software, hardware, operating platforms and protocols may be omitted so as not to unnecessarily obscure the disclosure in detail. Various substitutions, modifications, additions and/or rearrangements within the spirit and/or scope of the underlying inventive concept will become apparent to those skilled in the art from this disclosure.

According to various embodiments, an analog port interface can be provided to allow a microcontroller on one voltage domain to interface to an external circuit on another domain. By integrating this level shifting requirement capability into the microcontroller itself, the customer is spared both cost and complexity in his design and development, making it easier to develop microcontroller products.

According to various embodiments, the entire I/O circuitry can be operated by at least two different voltages, such as a first "normal" supply voltage of the microcontroller and a second supply voltage, for example a lower voltage provided by the system through an external pin or internally generated. The I/O circuitry comprises respective level shifters to allow control of the respective drive transistors of each port pin. Thus, the entire circuitry of an I/O port pin is controlled by a supply voltage that can be the normal supply voltage or another voltage supplied externally or generated internally. The internal voltage level shifters allow correct operation of the I/O components within the microcontroller. According to other embodiments, only certain I/O pins are allowed to be programmed to operate with different supply voltage. Some embodiments may allow users to program a voltage selection for each or some of the I/O pins.

According to an embodiment, an integrated circuit (IC) device may comprise a microcontroller with an input/output I/O circuitry comprising a plurality of input/output ports. The IC device may also comprise a plurality of external pins coupled with the microcontroller; wherein the microcontroller comprises an internal I/O voltage supply coupled with an external pin separate from a power supply pin, to allow operation of the I/O circuitry with different voltage levels. Alternatively, the device may not comprise an external pin and generate a, for example, a lower I/O voltage internally. Switches can be provided to either select the normal operating voltage of the device or the lower voltage, which may for example be generated internally by a regulator or a digital to analog converter for a main supply voltage of the I/O circuitry.

According to a further embodiment, the I/O voltage supply may comprise a switching unit operable to couple the I/O voltage supply with one of a plurality of supply voltages. According to a further embodiment, the switching unit can be operable to couple the I/O voltage supply with one of: an internal supply voltage provided by the power supply pin or an internal voltage regulator and an external I/O voltage provided by the external pin. According to a further embodiment, the switching unit further allows to select an internal voltage generated by a digital-to analog converter or any other internal voltage regulator or voltage reference. According to a further embodiment, the I/O voltage supply may comprise a buffer amplifier.

According to another embodiment, an I/O pin is configured as a multi-level serial transmitter output, may comprise transmitting a serial signal having at least three voltage levels including, a power supply voltage level, ground level, and an I/O supply voltage level.

Figure 2:
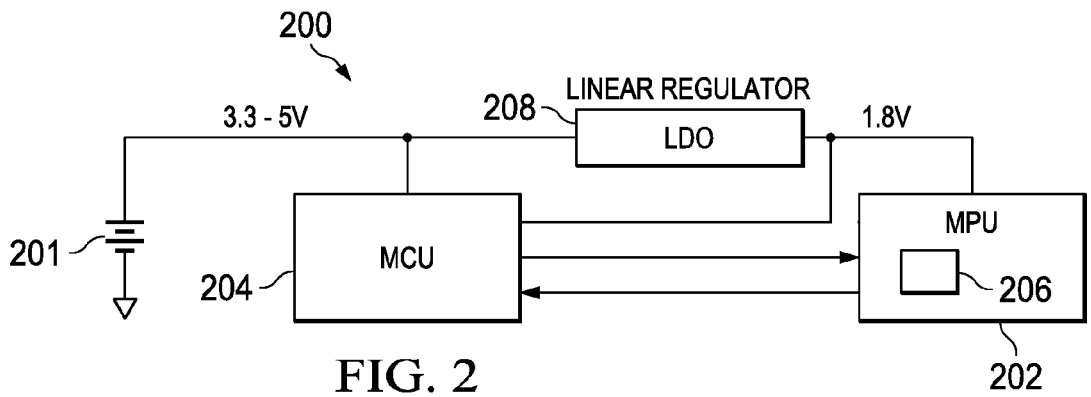
FIG. 2 is a diagram of a level shifting circuit configuration according to embodiments.

Turning now to FIG. 2 is a system 200 including a 3.3-5 V power supply 201, a microprocessor (MPU) unit 202 and a peripheral controller 204. The MPU 202 operates at 1.8 V, provided by line regulator 208. The peripheral controller 204 operates using the supply voltage of 3.3-5 V. Such a peripheral controller may, e.g., be used in a standby mode to perform battery monitoring or ADC (analog-to-digital converter) scans for a capacitive touch sensor (not shown). In such a circuit, the MPU 202 functions as the primary application controller. Embodiments, including circuitry 206, are able to eliminate the need for level shifting circuitry 106 of FIG. 1 by integrating relatively simple shifting capability into the MPU 202.

Figure 3:
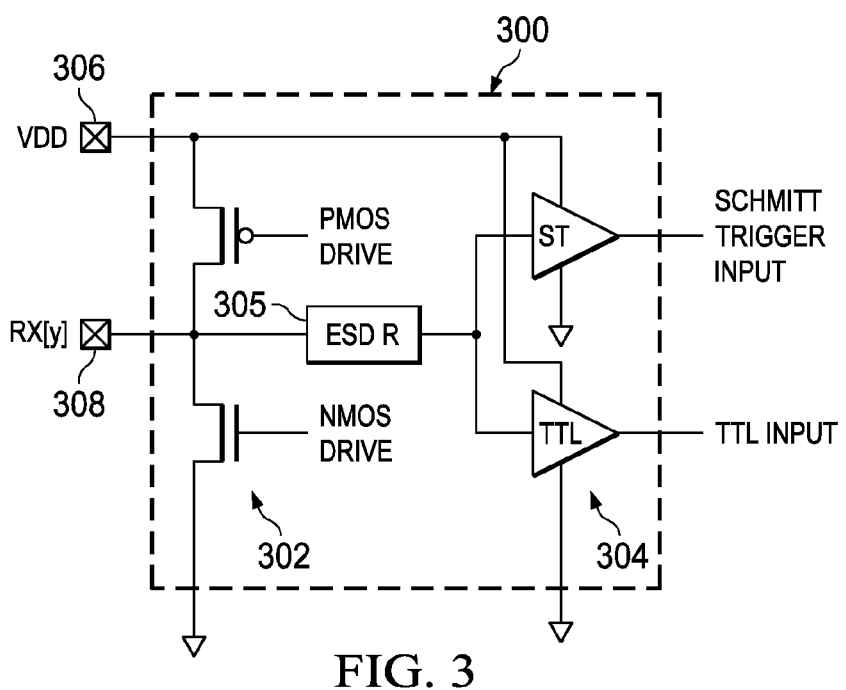
FIG. 3 is a diagram of an input port.

Shown in FIG. 3 is an input configuration or pad circuitry 300 for an integrated circuit. The input configuration 300 interfaces to a pin RX[y] 308 and includes level shifter 302, ESD protection 305, and tristate controls 304. As shown in FIG. 3, the supply voltage of pad circuitry 300 is connected to the supply voltage of the device Vdd. PMOS Drive and NMOS Drive are provided by port interface logic (not shown).

According to various embodiments, the supply voltage of an input/output circuit is matched to an external circuit's voltage supply. For example, to allow the pads to operate at a lower voltage, the external voltage is sensed and applied to the pad circuitry.

Figure 4:
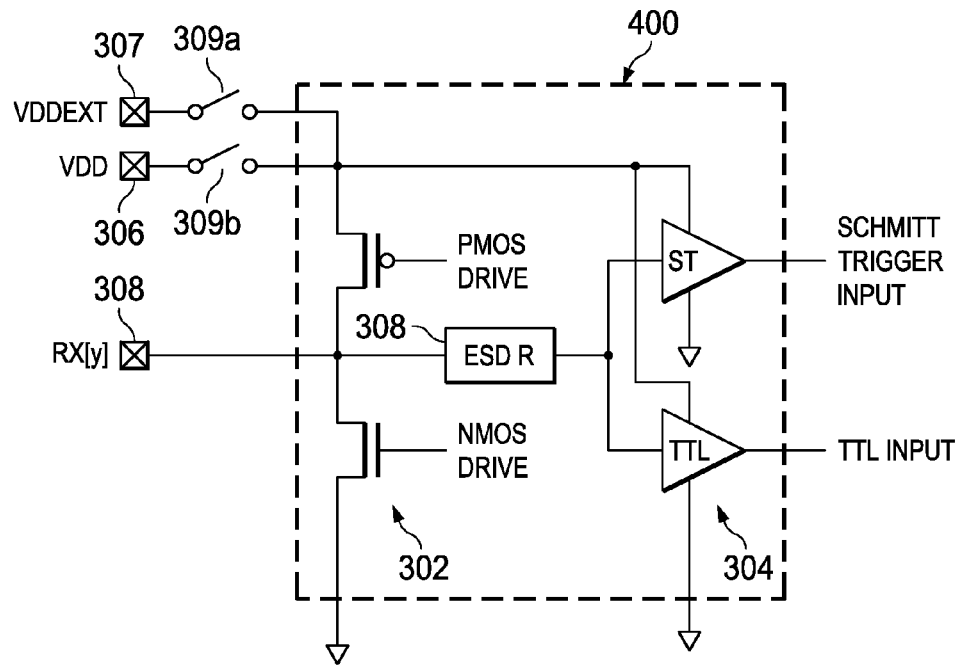
FIG. 4 is a diagram of an input port according to embodiments.

A system according to an embodiment is shown in FIG. 4. As shown, the input configuration circuitry 400 is generally similar to that of FIG. 3. However, the circuit of FIG. 4 further includes switches 309a, 309b for coupling the circuit 300 to Vdd and Vddext, i.e., two different voltage sources.

In the embodiment of FIG. 4, switches 309a, 309b allow the voltage supply of the external source (Vddext) to be brought into the microcontroller. This allows the entire I/O structure to run off of the external voltage (Vddext) or the device supply voltage Vdd.

Figure 5:
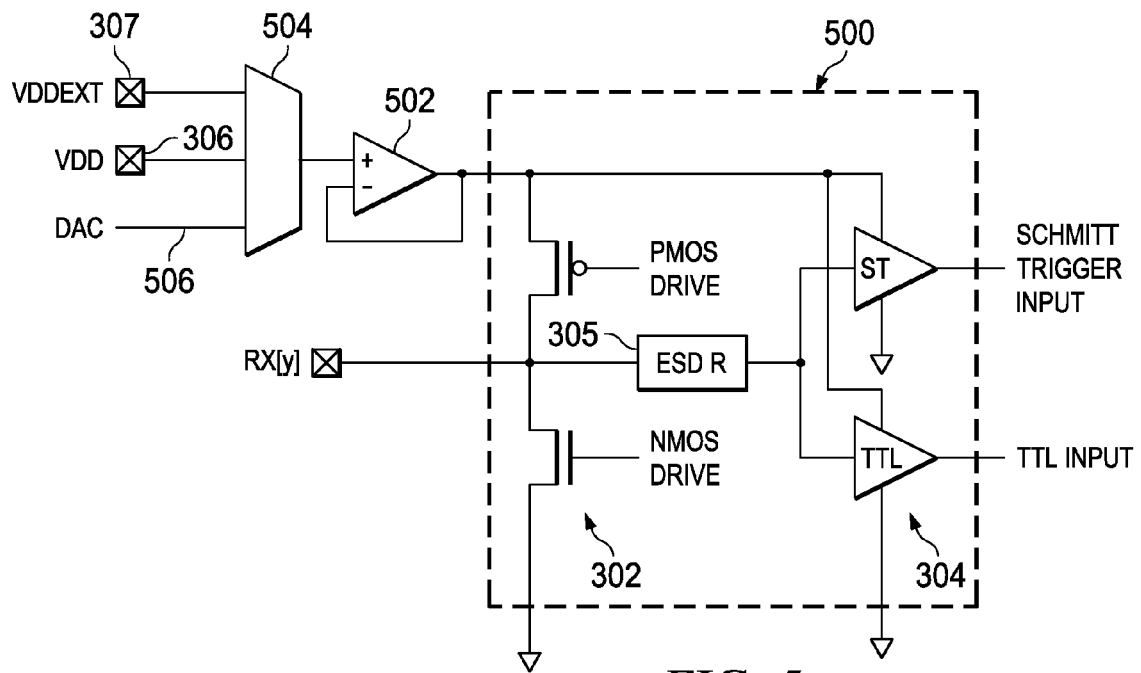
FIG. 5 is a diagram of an input port according to embodiments.

In other embodiments, as shown in FIG. 5, the external voltage source (Vddext) can be brought into an amplifier 502, such as a buffer amplifier, which in turn drives the supply voltage for the I/O structure 500. In this case a multiplexer 504 may be provided for selecting which of the supply voltages is provided to the input of the amplifier 502. In addition, in some embodiments, one of the voltages switched in to the circuit is an internal digital-to-analog converter 506. In this embodiment, the external voltage may be matched without having to accommodate for switch impedance as in the embodiment of FIG. 4. The active approach of FIG. 5 would also allow active level translation on an IO pad (change settings on the fly).

Figure 6:
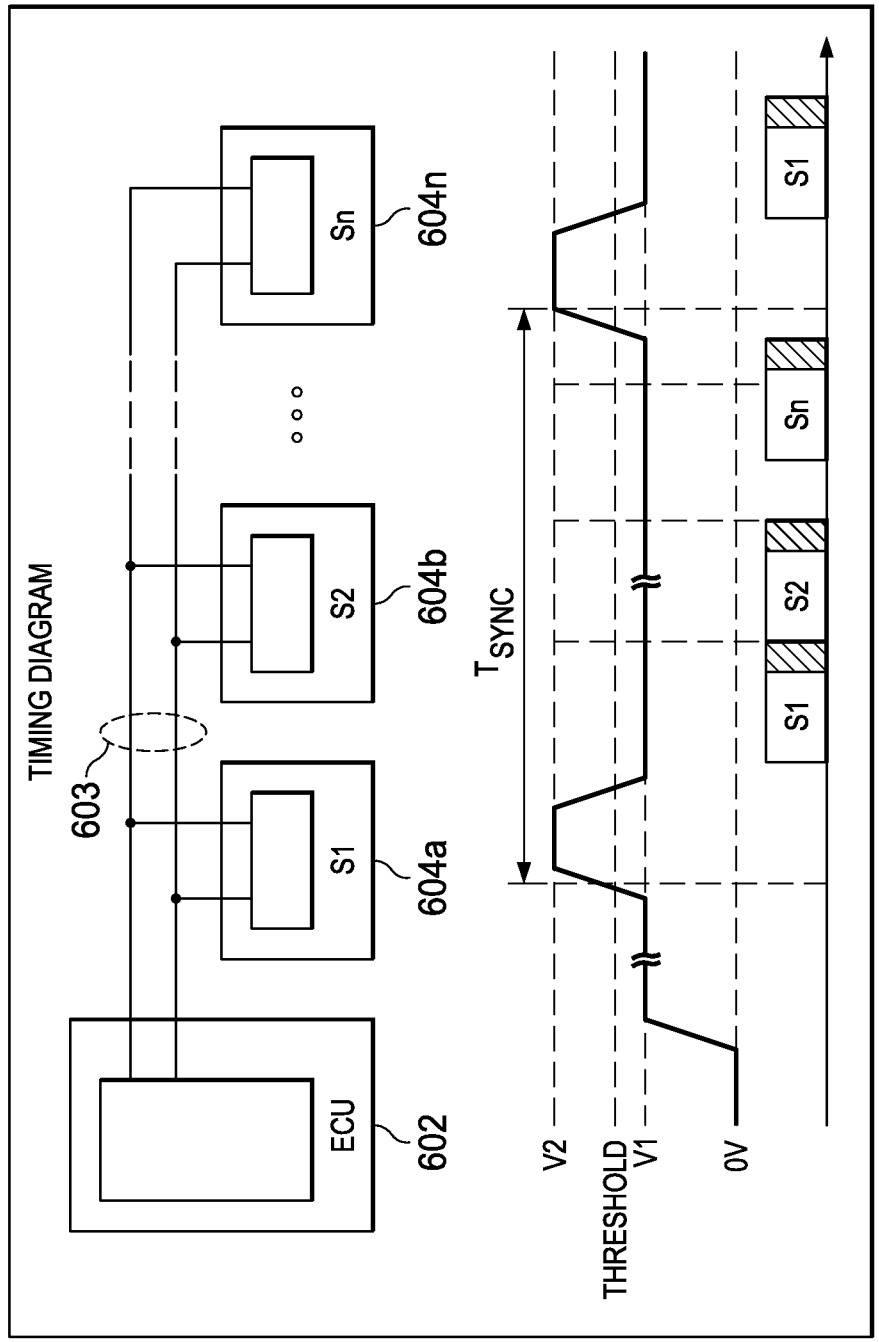
FIG. 6 is an exemplary bus topology that can be configured for use with embodiments.

This switching capability can also be used to support protocols that require more than two voltage levels as, for example, shown in FIG. 6. More particularly, FIG. 6 illustrates a PSI 5 bus topology. The bus topology includes a controller (ECU) 602, a bus 603, and a variety of sensors 604a, 604b, ... 604n.

In the PSI 5 protocol, data transmission and reception over the communications bus 603 are done using 0V and V1. However, in order to synchronize the data transmission, a voltage level V2 must be applied to the communication bus to allow all the slave modules (604*a-n*) to synchronize. Accordingly, embodiments may be used for selecting the operating voltages for the bus levels.

The above mentioned embodiments could be implemented beneficially in a low pin count development and integration. In summary, the component count around a microcontroller can be reduced for improved usage by customers.

Although the invention has been described with respect to specific embodiments thereof, these embodiments are merely illustrative, and not restrictive of the invention. The description herein of illustrated embodiments of the invention, including the description in the Abstract and Summary, is not intended to be exhaustive or to limit the invention to the precise forms disclosed herein (and in particular, the inclusion of any particular embodiment, feature or function within the Abstract or Summary is not intended to limit the scope of the invention to such embodiment, feature or function). Rather, the description is intended to describe illustrative embodiments, features and functions in order to provide a person of ordinary skill in the art context to understand the invention without limiting the invention to any particularly described embodiment, feature or function, including any such embodiment feature or function described in the Abstract or Summary.

While specific embodiments of, and examples for, the invention are described herein for illustrative purposes only, various equivalent modifications are possible within the spirit and scope of the invention, as those skilled in the relevant art will recognize and appreciate. As indicated, these modifications may be made to the invention in light of the foregoing description of illustrated embodiments of the invention and are to be included within the spirit and scope of the invention. Thus, while the invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the invention.

Reference throughout this specification to "one embodiment", "an embodiment", or "a specific embodiment" or similar terminology means that a particular feature, structure, or characteristic described in connection with the embodiment is included in at least one embodiment and may not necessarily be present in all embodiments. Thus, respective appearances of the phrases "in one embodiment", "in an embodiment", or "in a specific embodiment" or similar terminology in various places throughout this specification are not necessarily referring to the same embodiment. Furthermore, the particular features, structures, or characteristics of any particular embodiment may be combined in any suitable manner with one or more other embodiments. It is to be understood that other variations and modifications of the embodiments described and illustrated herein are possible in light of the teachings herein and are to be considered as part of the spirit and scope of the invention.

In the description herein, numerous specific details are provided, such as examples of components and/or methods, to provide a thorough understanding of embodiments of the invention. One skilled in the relevant art will recognize, however, that an embodiment may be able to be practiced without one or more of the specific details, or with other apparatus, systems, assemblies, methods, components, materials, parts, and/or the like. In other instances, well-known structures, components, systems, materials, or operations are not specifically shown or described in detail to avoid obscuring aspects of embodiments of the invention. While the invention may be illustrated by using a particular embodiment, this is not and does not limit the invention to any particular embodiment and a person of ordinary skill in the art will recognize that additional embodiments are readily understandable and are a part of this invention.

As used herein, the terms "comprises," "comprising," "includes," "including," "has," "having," or any other variation thereof, are intended to cover a non-exclusive inclusion. For example, a process, product, article, or apparatus that comprises a list of elements is not necessarily limited only those elements but may include other elements not expressly listed or inherent to such process, process, article, or apparatus.

Furthermore, the term "or" as used herein is generally intended to mean "and/or" unless otherwise indicated. For example, a condition A or B is satisfied by any one of the following: A is true (or present) and B is false (or not present), A is false (or not present) and B is true (or present), and both A and B are true (or present). As used herein, including the claims that follow, a term preceded by "a" or "an" (and "the" when antecedent basis is "a" or "an") includes both singular and plural of such term, unless clearly indicated within the claim otherwise (i.e., that the reference "a" or "an" clearly indicates only the singular or only the plural). Also, as used in the description herein and throughout the claims that follow, the meaning of "in" includes "in" and "on" unless the context clearly dictates otherwise.

It will be appreciated that one or more of the elements depicted in the drawings/figures can also be implemented in a more separated or integrated manner, or even removed or rendered as inoperable in certain cases, as is useful in accordance with a particular application. Additionally, any signal arrows in the drawings/Figures should be considered only as exemplary, and not limiting, unless otherwise specifically noted.

What is claimed is:

1. An integrated circuit (IC) device comprising:
    a microcontroller with an input/output I/O circuitry comprising a plurality of input/output ports, and
    a plurality of external pins coupled with the microcontroller;
    wherein the microcontroller comprises an I/O voltage supply comprising switching circuitry which is programmable through said microcontroller,
    at least one of the input/output ports is selectively connected to at least two different I/O supply voltages via switchable connections controlled by the switching circuitry, and
    wherein the microcontroller is configured to control the switching circuitry to dynamically and selectively control the switchable connections between the at least one input/output port and the at least two different I/O supply voltages, and
    wherein at least one of the at least two different I/O supply voltages is provided through one of the external pins and another one of the at least two different I/O supply voltages is an internal supply voltage of the microcontroller.

2. The IC device according to claim 1, wherein the I/O voltage supply is coupled with an external pin separate from a power supply pin through a multiplexer, wherein the multiplexer is controllable to select an external I/O voltage through said external pin being different from a power supply voltage available at the power supply pin or to select the internal supply voltage to allow operation of the I/O circuitry with different voltage levels.

3. The IC device according to claim 2, wherein the internal supply voltage is generated by an internal voltage regulator coupled with the power supply pin.

4. The IC device according to claim 3, wherein the multiplexer is operable to programmably couple the I/O voltage supply with at least one of: the internal supply voltage, an internal voltage other than the internal supply voltage and the external I/O voltage provided by the external pin.

5. The IC device according to claim 2, wherein the internal voltage is generated by a digital-to analog converter of the microcontroller.

6. The IC device according to claim 5, wherein the I/O voltage supply further comprises a buffer amplifier receiving a selected I/O supply voltage, wherein an output of the buffer amplifier provides a supply voltage to the at least some of the input/output ports.

7. A method of operating an IC device comprising a microcontroller with an input/output (I/O) circuitry comprising a plurality of input/output ports, the IC device comprising a plurality of external pins including at least one I/O pin coupled with one of the input/output ports of the plurality of input/output ports; wherein the microcontroller comprises an I/O voltage supply comprising a multiplexer which is programmable to select at least two different I/O supply voltages fed to said multiplexer, wherein a selected I/O supply voltage is fed to the one of the input/output ports and wherein the at least one I/O pin is configured as a multi-level serial transmitter output, wherein a serial signal is transmitted having at least three voltage levels including, a power supply voltage level, ground level, and an I/O supply voltage level.

8. A circuit arrangement comprising:
 a microcontroller having a plurality of external pins and a plurality of input/output ports and being operable to select between a plurality of supply voltages for said input/output ports,
 wherein a first pin of said plurality of external pins of the microcontroller is connected with a first voltage source of said plurality of supply voltages and a second pin of said plurality of external pins of the microcontroller is connected with a second voltage source of said plurality of supply voltages generating a voltage different from said first voltage source,
 wherein the microcontroller comprises a multiplexer having at least a first input, a second input, and an output,
 wherein the first input of the multiplexer is connected with the second pin of said plurality of external pins of the microcontroller and the second input of the multiplexer is connected to an internal supply voltage of the microcontroller, and
 wherein the output of the multiplexer provides an I/O power supply for at least some of the plurality of input/output ports of the microcontroller.

9. The circuit arrangement in accordance with claim 8, the multiplexer further receives an output voltage from a digital-to-analog converter, and wherein the microcontroller is configured to select said output voltage from the digital-to-analog converter as a supply voltage for said at least some of the plurality of input/output ports.

10. The circuit arrangement in accordance with claim 8, wherein an input/output port comprises a PMOS transistor and an NMOS transistor coupled between the I/O power supply and ground and wherein a node between the PMOS transistor and the NMOS transistor is connected with an external pin of the microcontroller.

11. The circuit arrangement in accordance with claim 9, wherein an input/output port comprises a PMOS transistor and an NMOS transistor coupled between the I/O power supply and ground and wherein a node between the PMOS transistor and the NMOS transistor is connected with an external pin of the microcontroller.

12. The circuit arrangement in accordance with claim 11, wherein the microcontroller further comprises a buffer amplifier coupled to an output of the multiplexer.

13. The circuit arrangement in accordance with claim 8, wherein the microcontroller comprises an internal voltage regulator coupled with first external pin and configured to generate the internal supply voltage from the voltage provided by the first voltage source.

14. A microprocessor in accordance with claim 8, wherein the microcontroller comprises a microcontroller core operating with the internal supply voltage and coupled with the at least some of the plurality of input/output ports.

15. An integrated circuit comprising:
 a plurality of external pins, including a first external pin connected to a first supply voltage and a second external pin connected to a second supply voltage different from the first supply voltage;
 a processor; and
 internal input/output circuitry configured to selectively switch between (a) a first connection between the processor and the first external pin such that the first supply voltage is applied to the processor and (b) a second connection between the processor and the second external pin such that the second supply voltage is applied to the processor, wherein an output driver of an external port of the internal input/output circuitry is configured to output the selected first or second supply voltage through an output transistor.

16. An integrated circuit in accordance with claim 15, the internal input/output circuitry comprising switches between each of the pins and associated pad circuitry of the input/output circuitry.

17. An integrated circuit in accordance with claim 15, further comprising a multiplexer interposed between the pins and associated pad circuitry of the input/output circuitry.

18. An integrated circuit in accordance with claim 17, further comprising a buffer between the multiplexer and the associated pad circuitry.

19. An integrated circuit in accordance with claim 15, wherein the input/output circuitry is further configured to select an internal digital-to-analog converter voltage.

* * * * *